United States Patent [19]
Ngo et al.

[11] Patent Number: 6,087,275
[45] Date of Patent: Jul. 11, 2000

[54] REDUCTION OF N-CHANNEL PARASITIC TRANSISTOR LEAKAGE BY USING LOW POWER/LOW PRESSURE PHOSPHOSILICATE GLASS

[75] Inventors: Minh Van Ngo, Union City; Sunil D. Mehta; Nicholas R. MacCrae, both of San Jose, all of Calif.

[73] Assignee: Advanced Micro Devices, Inc., Sunnyvale, Calif.

[21] Appl. No.: 08/843,150

[22] Filed: Apr. 26, 1997

[51] Int. Cl.[7] .................................................. H01L 21/31
[52] U.S. Cl. ........................ 438/780; 438/681; 438/784; 438/787
[58] Field of Search ................................. 438/780, 784, 438/437, 681, 787

[56] References Cited

U.S. PATENT DOCUMENTS

| | | | |
|---|---|---|---|
| 4,546,016 | 10/1985 | Kern | 427/255.3 |
| 4,952,254 | 8/1990 | Lee et al. | 438/437 |
| 5,409,743 | 4/1995 | Bouffard et al. | 427/579 |

*Primary Examiner*—David Nelms
*Assistant Examiner*—Reneé R Berry
*Attorney, Agent, or Firm*—H. Donald Nelson

[57] ABSTRACT

A method of manufacturing a semiconductor device with increasing threshold voltage for parasitic transistor by forming a low power-low pressure phosphosilicate glass layer on the active regions and the field oxide regions.

10 Claims, 7 Drawing Sheets

REDUCTION OF N-CHANNEL PARASITIC TRANSISTOR LEAKAGE BY USING LOW POWER/LOW PRESSURE PHOSPHOSILICATE GLASS

BACKGROUND OF THE INVENTION

1. Field of the Invention

This invention relates generally to the manufacture of high performance semiconductor devices. More specifically, this invention relates to a process for the manufacture of high performance semiconductor devices in which the threshold voltage of parasitic transistors is increased to prevent turn-on of the parasitic transistors during normal operation of the semiconductor device.

2. Discussion of the Related Art

Properly functioning electrical circuits require isolated devices that are connected through specific electrical paths. When fabricating silicon integrated circuits, it must be possible to electrically isolate devices built into the silicon from one another. These isolated devices can then be selectively interconnected to create the specific electrical circuit required. Because of the requirement for isolation of devices in a silicon substrate, isolation technology in one of the most important technologies is semiconductor manufacturing. Because bipolar integrated circuits were the first to be developed, a technology for isolating the collector regions in the bipolar devices was the first to be developed and was called junction isolation. PMOS and NMOS devices do not need junction isolation, but they do need an isolation structure that would prevent the establishment of parasitic channels between adjacent devices. The most important technique developed to establish isolation between adjacent devices is LOCOS isolation (LOCal Oxidation of Silicon). LOCOS technology involves the formation of semirecessed oxide regions in the nonactive (or field) regions of the substrate. CMOS devices require that isolation exist between devices in adjacent tubs as well as between devices within each tub.

As device geometry has reached the submicron region, conventional LOCOS isolation technologies reached the limits of their effectiveness, and alternative isolation processes for CMOS and bipolar technologies were needed. Modified LOCOS processes overcame some of the drawbacks of conventional LOCOS for some small-geometry devices. Other processes, such as trench isolation and selective-epitaxial isolation were developed.

Because MOS transistors are self-isolated and as long as the source-substrate and drain-substrate pn-junctions are held at reverse bias, the drain current should only be due to current flow from source to drain through a channel under the gate. This implies that no significant current between adjacent MOS devices exists if no channel exists between them. Thus, the buried n+-p junction needed to isolate bipolar transistors is not needed to isolate MOS circuits. The self-isolation nature of MOS devices represents substantial area savings for MOS circuits as compared to junction-isolated bipolar circuits and is one of the reasons for the shift to MOS devices by the semiconductor industry. Thus, integrated circuits having the highest component densities are fabricated with MOS technologies.

However, the phenomenon of parasitic transistor formation is a problem in MOS devices. The method that components are interconnected in an integrated circuit involves the fabrication of metal stripes that run across the oxide in the regions between the transistors. These metal stripes form the gates of parasitic MOS transistors, with the oxide beneath them forming a gate oxide and the diffused regions on either side of the oxide acting as the source and drain. In order for the parasitic transistors not to disrupt the operation of the MOS device, the threshold voltage of the parasitic transistor must be kept higher than any possible operating voltage so that spurious channels will not be formed between devices.

Therefore, to effectively isolate MOS transistors, it is necessary to prevent the formation of channels in the field regions. This implies that a large value of threshold voltage for the parasitic transistor is needed in the field regions. It has been determined that the threshold voltage of the field regions needs to be 3–4 volts above the supply voltage to ensure that less than 1 picoampere of current flows between isolated MOS devices. Therefore, for effective isolation in a circuit with a supply voltage of five volts, the minimum field-region threshold voltage must be in the range of 8–9 volts. Non-volatile circuits have higher programming voltages than the normal supply voltages and can reach 14–15 volts. Another factor that has a strong effect on the threshold voltage is the polarity of the charge present in the interlevel dielectric. A positive charge in the interlevel dielectric reduces the threshold voltage and a negative charge increases the threshold voltage.

Two of the methods developed for raising the threshold voltage in a normal (non-parasitic) MOS transistor have been used to increase the field region threshold voltage (of the parasitic transistors). These involve increasing the field oxide thickness and raising the doping beneath the field oxide. As can be appreciated, if the field oxide was made sufficiently thick, it alone could cause a high enough threshold voltage in the parasitic transistor to prevent it from turning on. However, this gives rise to step coverage problems and reduced field-oxide thicknesses are preferred. To achieve a sufficiently large field threshold voltage with the thinner field oxides, the doping under the field oxide must be increased.

The field oxide is typically made seven to ten times thicker than the gate oxide in the active regions. The thick field oxide also has the beneficial effect of reducing the parasitic capacitance between interconnect runners and the substrate, improving the speed characteristics of the integrated circuit. Normally, ion implantation is used to increase the doping under the field oxide. This ion implantation process is called a "channel-stop implant." The combination of thick oxides and channel-stop implants can provide adequate isolation for PMOS and NMOS integrated circuits. However, additional isolation considerations for CMOS circuits are necessary. In CMOS devices, like kinds of devices within a given well must be isolated in the same manner as the devices in either NMOS or PMOS devices, that is, through a combination of a thick field oxide and channel-stop doping. However, the isolation requirement of CMOS technology is greater because it is also necessary to isolate the p- and n-channel devices from one another. This additional isolation requirement must satisfy two requirements: (1) any possible leakage currents that could flow between adjacent PMOS and NMOS devices must be suppressed; and (2) the susceptibility of the CMOS devices to latchup must be minimized. The added requirement for the isolation of p- and n-channel devices has a penalty because such isolation requires more area than between like types of devices. The large area penalty of p- and n-channel device isolation is one reason why CMOS technologies using conventional isolation methods cannot achieve as high a packing density as NMOS.

Therefore, what is needed is a method of increasing the threshold voltage of MOS devices without increasing the field oxide thickness.

SUMMARY OF THE INVENTION

The present invention is directed to a method of manufacturing a semiconductor device with increased threshold voltage for parasitic transistors by forming a low power-low pressure phosphosilicate glass layer over the active regions and the field oxide regions.

A planarized TEOS layer is formed over the low power-low pressure phosphosilicate glass layer.

A metal layer is formed over the planarized TEOS layer.

An undoped oxide layer is formed between the phosphosilicate glass layer and the active regions and the field oxide regions.

The low power-low pressure phosphosilicate glass layer is formed using the process parameters:

$SiH_4$ at approximately 300 sccm; $PH_3$ at approximately 440 sccm; $N_2O$ at approximately 9500 sccm; $N_2$ at approximately 100 sccm; HF power equal to 450 watts; LF power equal to 300 watts; pressure at approximately 1.8 torr; temperature at 400° C.; and chamber conditioning for 120 seconds.

The present invention is also directed to a method of manufacturing a semiconductor device having a polysilicon interconnect layer over a field oxide layer and further having a higher threshold voltage for parasitic transistors by forming a low power-low pressure phosphosilicate glass layer over the active regions and the polysilicon interconnect layer.

A planarized TEOS layer is formed over the low power-low pressure phosphosilicate glass layer.

A metal layer is formed over the planarized TEOS layer.

An undoped oxide layer is formed between the phosphosilicate glass layer and the active regions and the field oxide regions.

The low power-low pressure phosphosilicate glass layer is formed using the process parameters:

$SiH_4$ at approximately 300 sccm; $PH_3$ at approximately 440 sccm; $N_2O$ at approximately 9500 sccm; $N_2$ at approximately 100 sccm; HF power equal to 450 watts; LF power equal to 300 watts; pressure at approximately 1.8 torr; temperature at 400° C.; and chamber conditioning for 120 seconds.

The present invention is better understood upon consideration of the detailed description below, in conjunction with the accompanying drawings. As will become readily apparent to those skilled in the art from the following description, there is shown and described an embodiment or embodiments of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Reference is now made in detail to specific embodiments of the present invention that illustrate the best modes presently contemplated by the inventors for practicing the invention.

Figure 1:
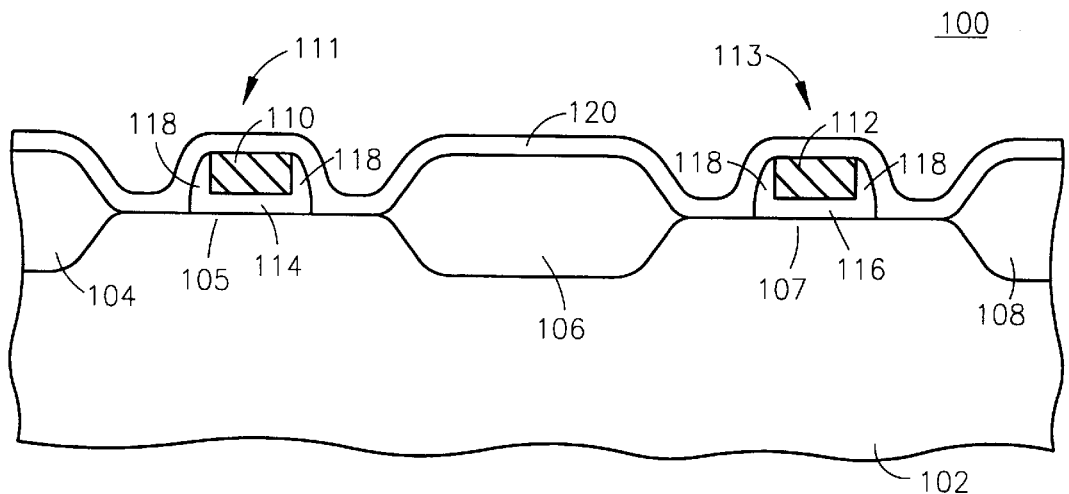
FIG. 1 shows a partially completed prior art semiconductor device having two transistors partially completed and separated by a field oxide region.
Figure 2:
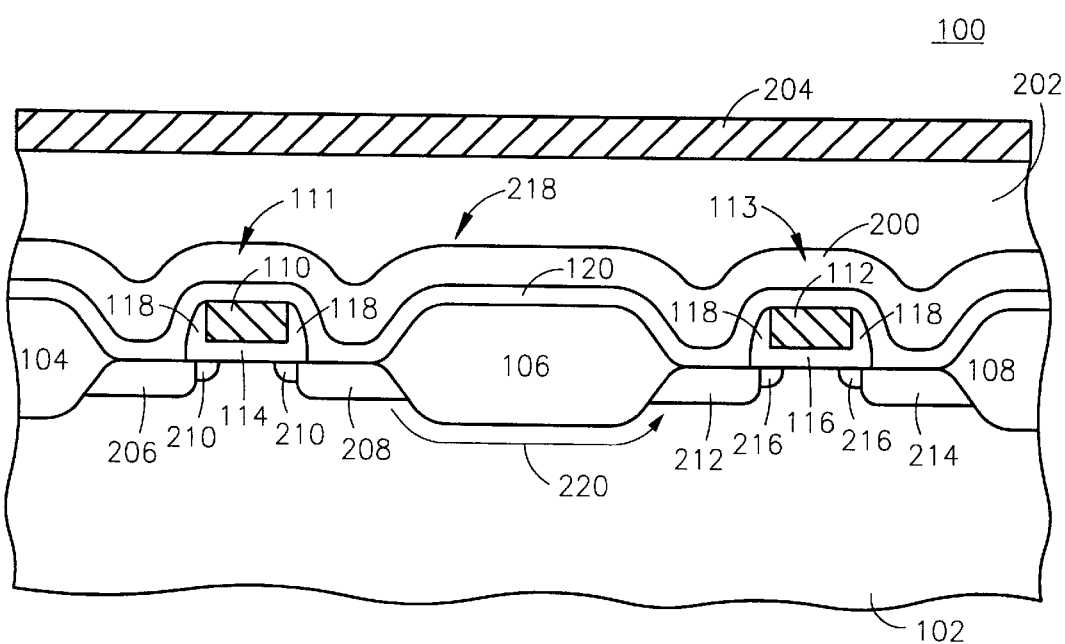
FIG. 2 shows the partially completed prior art semiconductor device shown in FIG. 1 with a PSG layer formed using a prior art process.

FIGS. 1 and 2 show a partially completed semiconductor device 100 manufactured in accordance with a prior art process. FIG. 1 shows the partially completed semiconductor device 100 formed on the semiconductor substrate 102. The field oxide regions 104, 106, and 108 are formed in the substrate 102 and serve to isolate the active region 105 and the active region 107 from each other and from other active regions in the substrate 102. The polysilicon gates 110 & 112 are formed on gate oxide regions 114 & 116 with sidewall spacers 118 formed around the polysilicon gates 110 & 112. The polysilicon gate 110 is part of a transistor 111 and polysilicon gate 112 is part of a transistor 113. An undoped oxide layer 120 is formed on the surface of the partially completed semiconductor device 100. The undoped oxide layer 120 is typically 500 Å thick.

Figure 9:
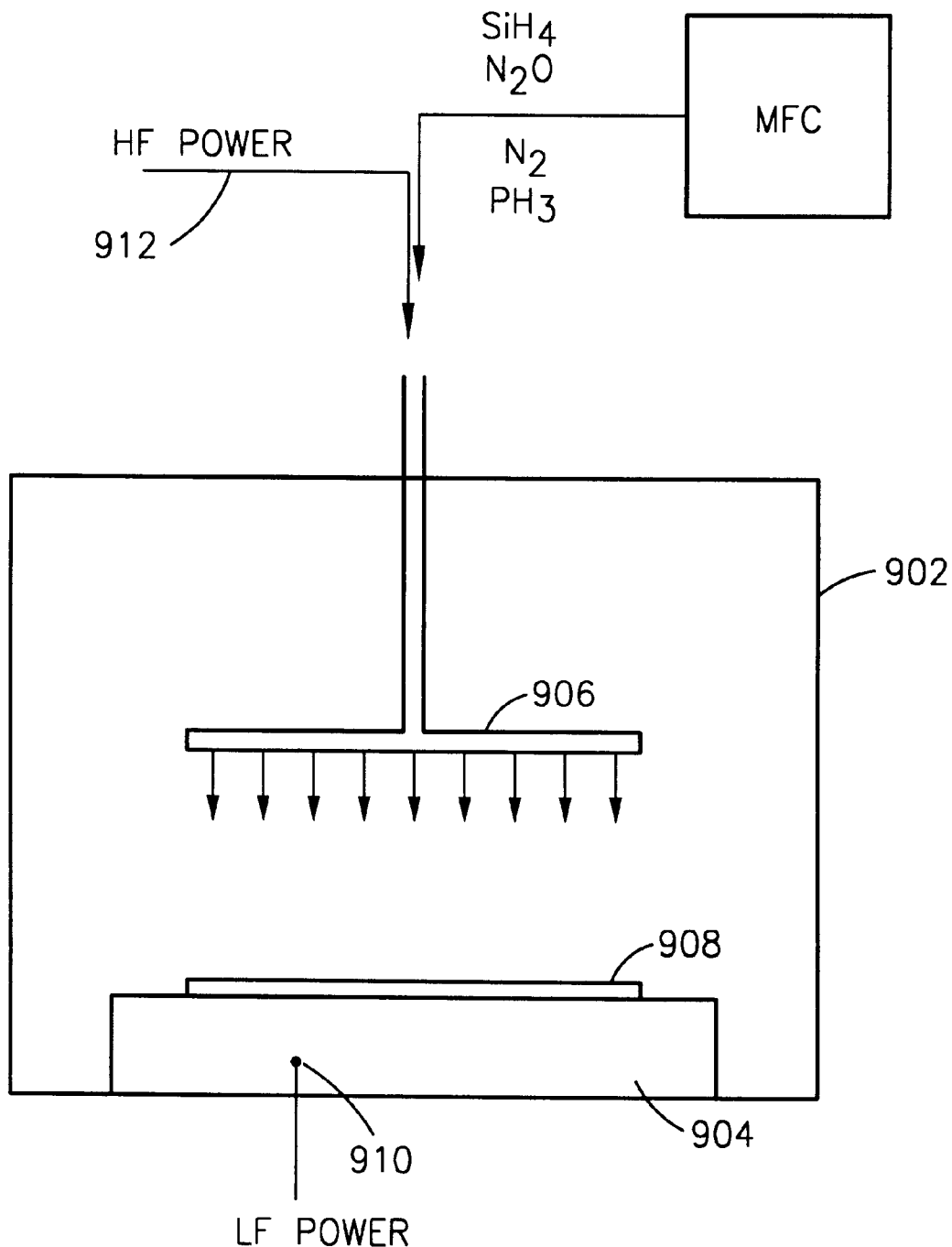
FIG. 9 shows a manufacturing process tool that can be used for the deposition of the PSG layer.

FIG. 2 shows the partially completed prior art semiconductor device 100 shown in FIG. 1 with a PSG (phosphosilicate glass) layer 200 formed on the undoped oxide layer 120. In this figure and in subsequent figures, like numerals denote like elements. The PSG layer 200 is formed in a manufacturing process tool 900 as shown in FIG. 9 and is typically approximately 3000 Å thick. The process parameters for forming the PSG layer 200 in the prior art semiconductor device 100 are:

| | |
|---|---|
| SiH$_4$ = 300 ± 10 sccm | HF Power = 600 watts |
| PH$_3$ = 500 ± 15 sccm | LF Power = 400 watts |
| N$_2$O = 9500 sccm | Pressure = 2.4 torr |
| N$_2$ = 1200 sccm | Temperature = 400° C. |

Chamber conditioning: precoat 60 seconds and temperature soak 20 seconds. These process parameters form a medium power/medium pressure PSG film.

A layer of TEOS (tetraethyl orthosilicate) deposited oxide film 202 is formed on the PSG layer 200. The method of forming the TEOS oxide film 202 is to deposit a thick layer of the TEOS material and then to polish the TEOS material until it is substantially flat (planarized) and approximately 7000 Å thick. The method of polishing the TEOS material is well known in the semiconductor manufacturing art and will not be discussed. After the TEOS material is polished flat, the metal layer one 204 is formed. As is known in the semiconductor art, the metal layer one 204 serves to electrically interconnect components in the semiconductor device. Typically, the metal layer one 204 structure is formed by depositing a blanket layer of the metal layer material on the flat TEOS layer 204 and the interconnect pattern is formed by etching away unwanted metal material. The source region 206 and the drain region 208 are formed as part of the transistor 111 and the LDD (lightly doped drain) regions 210 are formed as part of the transistor 111. Similarly, the source region 212 and the drain region 214 are formed as part of the transistor 113 and the LDD regions 216 are formed as part of the transistor 113. As is known in the semiconductor art, in an NMOS device the substrate is typically a lightly doped p type material and the source and drain regions are heavily doped n+ regions. During operation of the semiconductor device, a voltage potential can be present on the metal one 204 interconnect layer. This voltage potential can be as high as 15 volts in a non-volatile semiconductor device. The voltage potential causes the field oxide layer 106 to act as a gate oxide layer and with the drain region 208 of the transistor 111 and the source region 212 of the transistor 113 a parasitic transistor 218 is formed with an induced "channel" indicated by arrow 220. The parasitic transistor 218 exhibits normal transistor characteristics including threshold voltage. One of the methods to decrease the effect of the parasitic transistor 118 is to increase the threshold voltage of the parasitic transistor so that it never turns on during normal operation of the integrated circuit.

Figure 3:
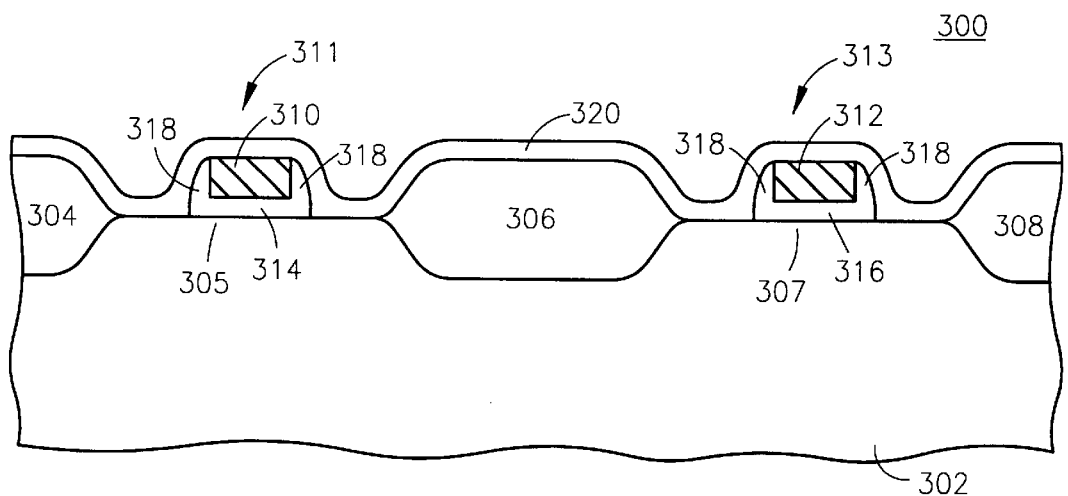
FIG. 3 shows a partially completed semiconductor device similar to the semiconductor device shown in FIG. 1 having two transistors partially completed and separated by a field oxide region.
Figure 4:
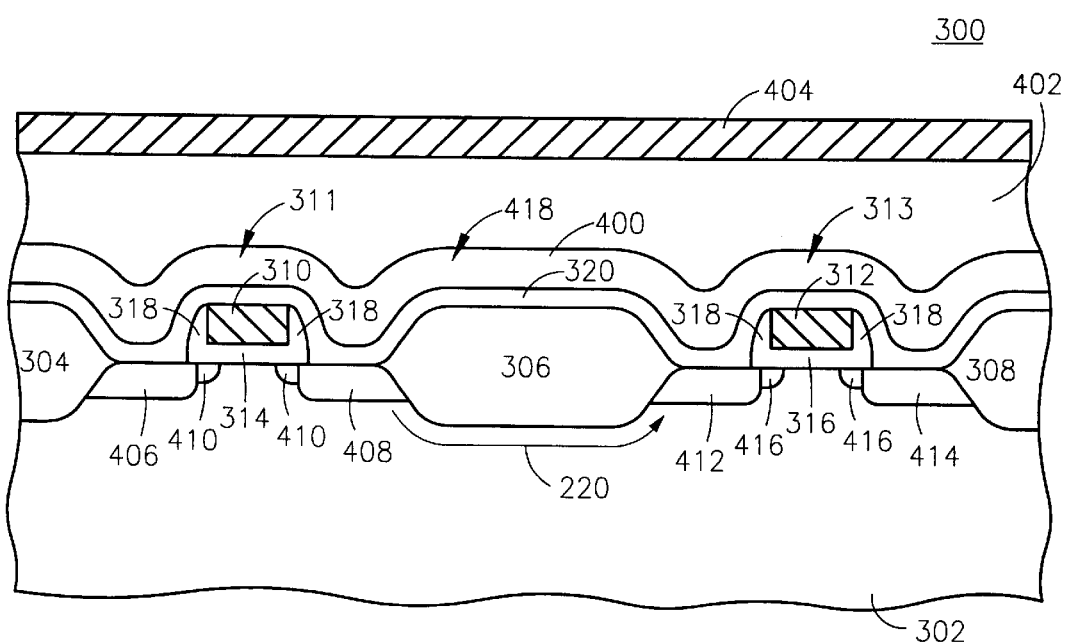
FIG. 4 shows the partially completed prior art semiconductor device shown in FIG. 3 with a PSG layer formed using a process in accordance with the present invention.

FIGS. 3 & 4 show a partially completed semiconductor device 300 manufactured in accordance with the present invention. FIG. 3 shows the partially completed semiconductor device 300 formed on the semiconductor substrate 302. The field oxide regions 304, 306, and 308 are formed on the semiconductor substrate 302 and serve to isolate the active region 305 and the active region 307 from each other and from other active regions in the substrate 102. The polysilicon gates 310 & 312 are formed on the gate oxide regions 314 & 316 with the sidewall spaces 318 formed around the polysilicon gates 110 & 112. The polysilicon gate 310 is part of the transistor 311 and the polysilicon gate 312 is part of the transistor 313. An undoped oxide layer 320 is formed on the surface of the partially completed semiconductor device 300. The undoped oxide layer 320 is typically 500 Å thick.

FIG. 4 shows the partially completed prior art semiconductor device 300 shown in FIG. 3 with the PSG (phosphosilicate glass) layer 400 formed on the undoped oxide layer 120. The PSG layer 400 can be formed in a manufacturing process tool such as the one shown in FIG. 9 and the PSG layer 400 is typically approximately 3000 Å thick. The process parameters for forming the PSG layer 400 in accordance with the present invention are:

| | |
|---|---|
| SiH$_4$ = 300 sccm | HF Power = 450 watts |
| PH$_3$ = 440 sccm | LF Power = 300 watts |
| N$_2$O = 9500 sccm | Pressure = 1.8 torr |
| N$_2$ = 1200 sccm | Temperature = 400° C. |

Chamber conditioning=120 seconds.

These process parameters provide a low power/low pressure PSG layer 400 in accordance with the present invention.

A layer of TEOS (tetraethyl orthosilicate) deposited oxide film 402 is formed on the PSG layer 400. The method of forming the TEOS oxide film 402 is to deposit a thick layer of the TEOS material and then to polish the TEOS material until it is substantially flat (planarized) and approximately 7000 Å thick. The method of polishing the TEOS material is well known in the semiconductor manufacturing art and will not be discussed. After the TEOS material is polished substantially flat, the metal layer one 404 is formed. As is known in the semiconductor art, the metal layer one 404 serves to electrically interconnect components in the semiconductor device. One of the purposes for a flat TEOS oxide film is to provide a flat surface for the deposition of the metal layer one 404 which is formed on the TEOS 404 layer. The metal layer one 404 film serves to electrically interconnect components in the semiconductor device. Typically, the metal layer one 402 structure is formed by depositing a blanket layer of the metal layer material on the flat TEOS layer 404 and the interconnect pattern is formed by etching away unwanted metal material. The source region 406 and the drain region 408 are formed as part of the transistor 311 and the LDD regions 410 are formed as part of the transistor 311. Similarly, the source region 412 and the drain region 414 are formed as part of the transistor 413 and the LDD regions 416 are formed as part of the transistor 413. As is known in the semiconductor art, in an NMOS device the substrate is typically a lightly doped p type material and the source and drain regions are heavily doped n+ regions. During operation of the semiconductor device, a voltage potential can be present on the metal one 404 interconnect layer. This voltage potential can be as high as 15 volts in a non-volatile semiconductor device. The voltage potential and the orientation of the various elements in the semiconductor device 300 can form a "parasitic transistor" in the device. For example, the field oxide layer 306 can act as a thick gate oxide layer and the drain region 408 of the transistor 311 and the source region 412 of the transistor 313 a parasitic transistor 418 is formed with an induced "channel" indicated by arrow 420. The arrow 420 indicates the leakage current from the drain 408 of transistor 311 to the source 412 of transistor 412. The parasitic transistor 418 has the potential to act as a transistor in the circuit and as a result degrades the performance of the semiconductor device. The low power/low pressure PSG film as formed by the present invention increases the "threshold voltage" of the parasitic transistor 418 and prevents it from tuning on during normal operation of the semiconductor device 300.

Figure 5:
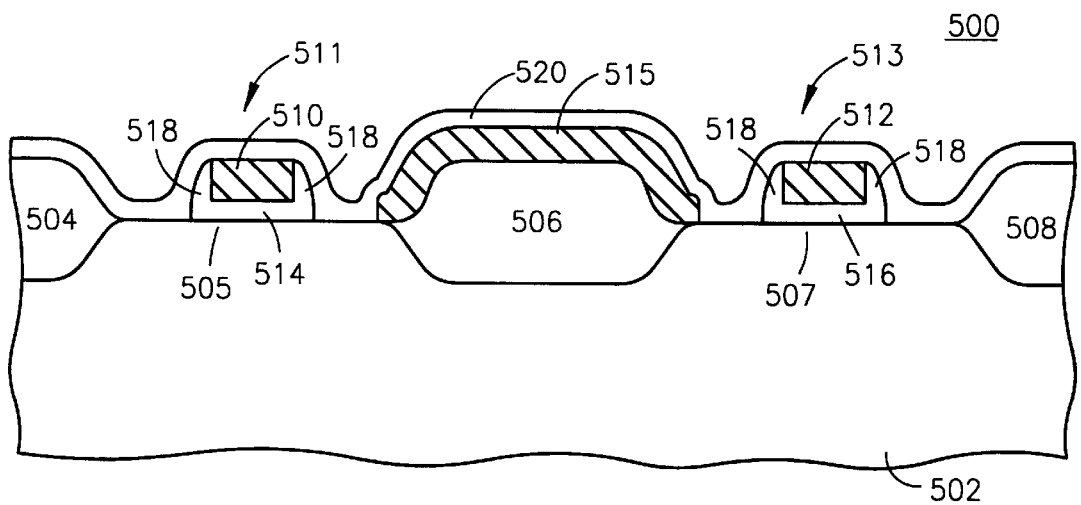
FIG. 5 shows a partially completed prior art semiconductor device having two transistors partially completed and separated by a field oxide region and having a polysilicon layer formed on the field oxide region.
Figure 6:
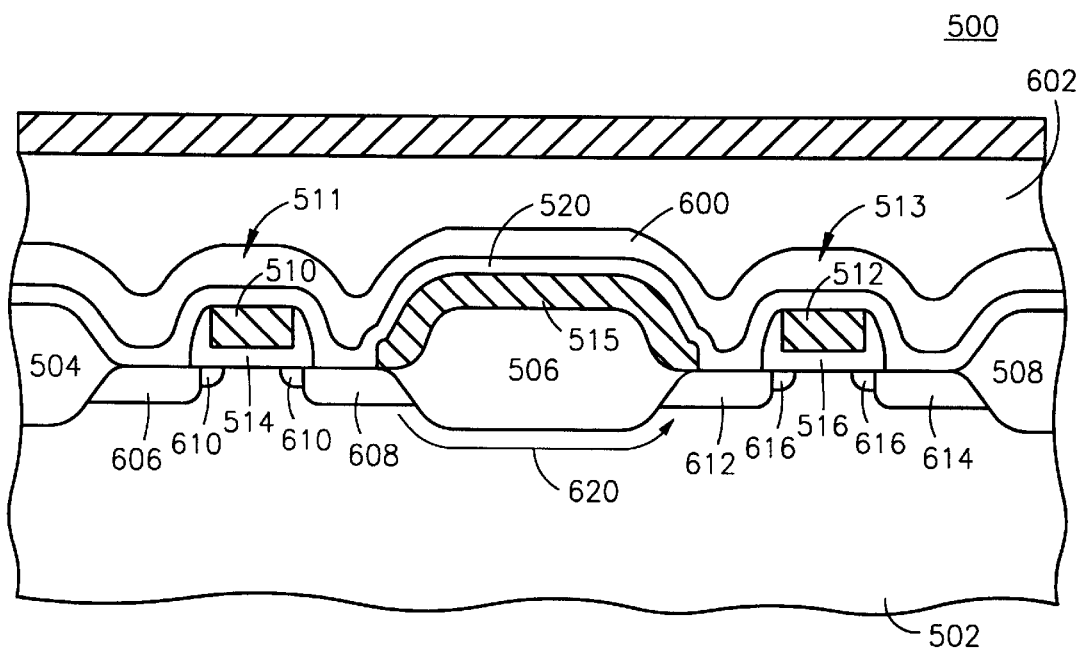
FIG. 6 shows the partially completed prior art semiconductor device shown in FIG. 5 with a PSG layer formed using a prior art process.

FIGS. 5 & 6 show a partially completed second semiconductor device 500 manufactured in accordance with the prior art process. FIG. 5 shows the partially completed semiconductor device 500 formed on the semiconductor substrate 502. The field oxide regions 504, 506, and 508 are formed in the substrate 502 and serve to isolate the active region 505 and the active region 507 from each other and from other active regions in the substrate 102. The polysilicon gates 510 & 512 are formed on the gate oxide regions 514 & 516 with the sidewall spacers 518 formed around the polysilicon gates 510 & 512. The polysilicon gate 510 is part of the transistor 511 and the polysilicon gate 512 is part of the transistor 513. The polysilicon layer 515 is shown formed on the field oxide region 506. The polysilicon layer 515 can be used as an interconnect layer when highly doped. The undoped oxide layer 520 is formed on the surface of the partially completed semiconductor device 500. The undoped oxide layer 520 is typically 500 Å thick.

FIG. 6 shows the partially completed prior art semiconductor device 500 shown in FIG. 5 with the PSG (phosphosilicate glass) layer 600 formed on the undoped oxide layer 520. In this figure and in subsequent figures, like numerals denote like elements. The PSG layer 500 is formed in a manufacturing process tool 900 such as the one shown in FIG. 9 and is typically approximately 3000 Å thick. The process parameters for forming the PSG layer 600 in the prior art semiconductor device 500 are:

| | |
|---|---|
| $SiH_4$ = 300 ± 10 sccm | HF Power = 600 watts |
| $PH_3$ = 500 ± 15 sccm | LF Power = 400 watts |
| $N_2O$ = 9500 sccm | Pressure = 2.4 torr |
| $N_2$ = 1200 sccm | Temperature = 400° C. |

Chamber conditioning: precoat 60 seconds and temperature soak 20 seconds. These process parameters form a medium power/medium pressure PSG film 600.

A layer of TEOS (tetraethyl orthosilicate) deposited oxide film 602 is formed on the PSG layer 600. The method of forming the TEOS oxide film 602 is to deposit a thick layer of TEOS material and then to polish the TEOS material until it is substantially flat (planarized) and approximately 7000 Å thick. The method of polishing TEOS is well known in the semiconductor manufacturing art and will not be discussed. After the TEOS film is polished substantially flat metal layer one 604 is formed. As is known in the semiconductor art, metal layer one serves to electrically interconnect components in the semiconductor device. The source region 606 and the drain region 608 are formed as part of the transistor 511 and the LDD regions 610 are formed as part of the transistor 511. Similarly, the source region 612 and the drain region 614 are formed as part of the transistor 513 and the LDD regions 616 are formed as part of the transistor 513. As is known in the semiconductor art, in an NMOS device the substrate is typically a lightly doped p type material and the source and drain regions are heavily doped n+ regions. During operation of the semiconductor device, a voltage potential can be present on the polysilicon layer 515 used as an interconnect layer. This voltage potential can be as high as 15 volts in a non-volatile semiconductor device. The voltage potential causes the field oxide layer 506 to act as a gate oxide layer and with the drain region 608 of the transistor 511 and the source region 612 a parasitic transistor 618 is formed with an induced "channel" indicated by arrow 620. The parasitic transistor 618 exhibits transistor characteristics including threshold voltage. One method to decrease the effect of the parasitic transistor is to increase the threshold voltage of the parasitic transistor so that it never turns on.

Figure 7:
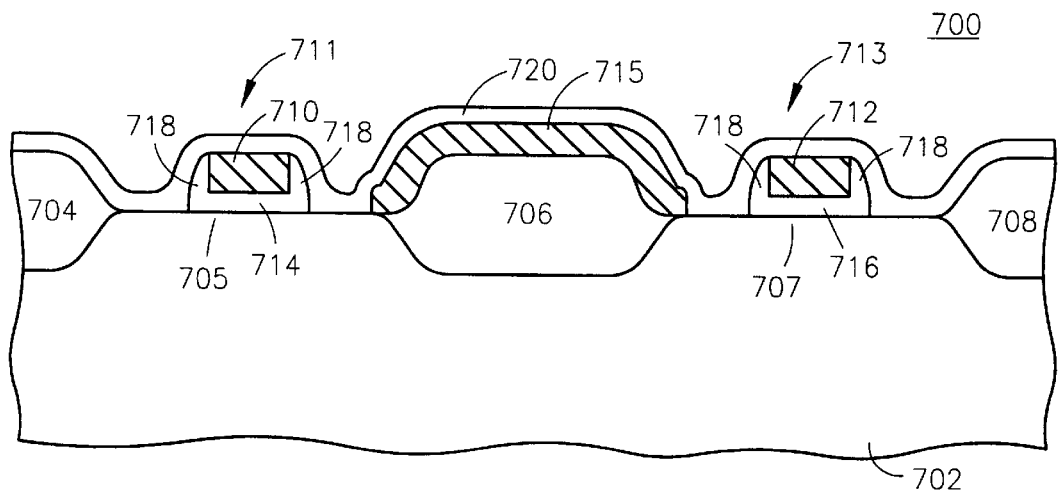
FIG. 7 shows a partially completed semiconductor device similar to the semiconductor device shown in FIG. 5 having two transistors partially completed and separated by a field oxide region and having a polysilicon layer formed on the field oxide region.
Figure 8:
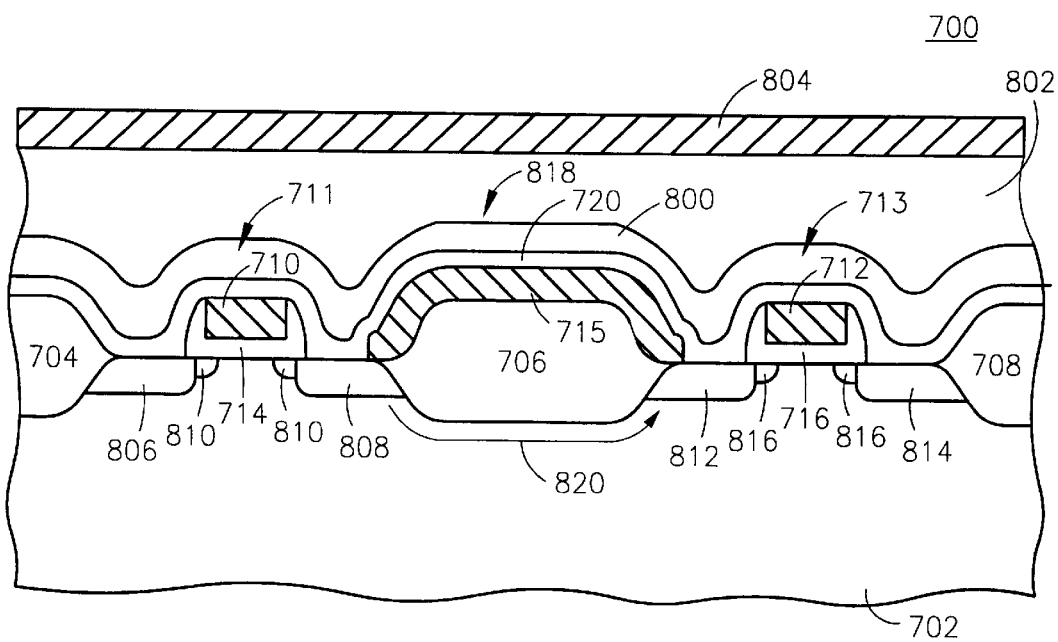
FIG. 8 shows the partially completed semiconductor device shown in FIG. 7 with a PSG layer formed using a process in accordance with the present invention.

FIGS. 7 & 8 show a partially completed second semiconductor device 700 manufactured in accordance with the present invention. FIG. 7 shows the partially completed semiconductor device 700 formed in the substrate 702. The field oxide regions 704, 706, and 708 are formed in the substrate 702 and serve to isolate the active region 705 and the active region 707 from each other and from other active regions in the substrate 702. The polysilicon gates 710 & 712 are formed on the gate oxide regions 714 & 716 with the sidewall spacers 718 formed around the polysilicon gates 710 & 712. The polysilicon gate 710 is part of the transistor 711 and the polysilicon gate 712 is part of the transistor 713. The polysilicon layer 715 is shown formed on the field oxide region 706. The polysilicon layer 715 can be used as an interconnect layer when highly doped. The undoped oxide layer 720 is formed on the surface of the partially completed semiconductor device 700. The undoped oxide layer 720 is typically 500 Å thick.

FIG. 8 shows the partially completed semiconductor device 700 shown in FIG. 7 with the PSG (phosphosilicate glass) layer 800 formed on the undoped oxide layer 720. In this figure and in subsequent figures, like numerals denote like elements. The PSG layer 800 is formed in a manufacturing process tool 900 such as the one shown in FIG. 9 and is typically approximately 3000 Å thick. The process parameters for forming the PSG layer 800 in the prior art semiconductor device 700 are:

| | |
|---|---|
| $SiH_4$ = 300 sccm | HF Power = 450 watts |
| $PH_3$ = 440 sccm | LF Power = 300 watts |
| $N_2O$ = 9500 sccm | Pressure = 1.8 torr |
| $N_2$ = 1200 sccm | Temperature = 400° C. |

Chamber conditioning=120 seconds. These process parameters form a low power/low pressure PSG film 800.

A layer of TEOS (tetraethyl orthosilicate) deposited oxide film 802 is formed on the PSG layer 800. The method of depositing the TEOS oxide film 802 is to deposit a thick layer of TEOS material and then to polish the TEOS material until it is substantially flat (planarized) and approximately 7000 Å thick. The method of polishing the TEOS material is well known in the semiconductor manufacturing art and will not be discussed. After the TEOS film is polished substantially flat, the metal layer one 804 is formed. As is known in the semiconductor art the metal layer one 804 serves to electrically interconnect components in the semiconductor device. The source region 806 and the drain region 808 are formed as part of the transistor 711 and the LDD regions 810 are formed as part of the transistor 711. Similarly, the source region 812 and the drain region 814 are formed as part of the transistor 713 and the LDD regions 816 are formed as part of the transistor 713. During operation of the semiconductor device, a voltage potential can be present on the polysilicon layer 715 used as an interconnect layer. This voltage potential can be as high as 15 volts in a non-volatile semiconductor device. The voltage potential causes the field oxide layer 706 to act as a gate oxide layer and with drain region 808 of transistor 711 and source region 812 a parasitic transistor 818 is formed with the induced "channel" indicated by arrow 820. The parasitic transistor 818 exhibits transistor characteristics including threshold voltage. One method to decrease the effect of the parasitic transistor is to increase the threshold voltage of the parasitic transistor so that it never turns on during normal operation of the semiconductor device.

FIG. 9 shows a device 900 that can be used to form the PSG layer. The device 900 has an airtight enclosure 902 with a heater block 904 and a showerhead structure 906. The heater block 904 holds a wafer 908 and has a low frequency (LF) power input 910. The showerhead structure 906 has an input of high frequency (HF) power input 912 and the following gases are input to the shower head structure 906: silane ($SiH_4$); nitrous ($N_2O$); nitrogen ($N_2$); and phosphene (PH3).

Figure 10:
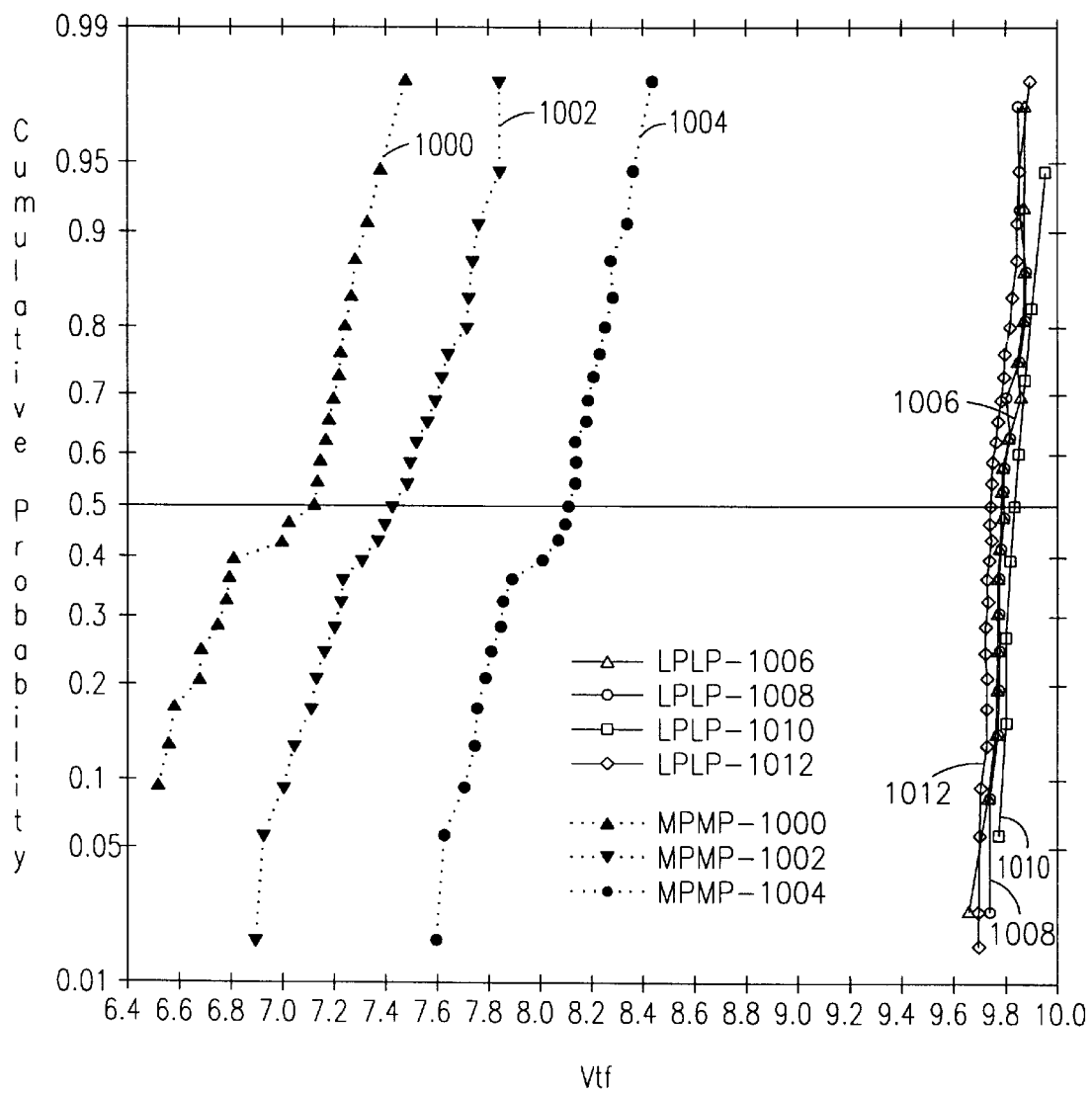
FIG. 10 compares measured values of the threshold voltages for three samples using a prior art PSG layer with measured values of the threshold voltages for four samples using a PSG layer in accordance with the present invention.

FIG. 10 compares the threshold voltages 1000, 1002, and 1004 of semiconductor devices manufactured in accordance with the prior art with the threshold voltages 1006, 1008, 1010 and 1012 of similar semiconductor devices manufactured in accordance with the present invention. The comparison of the threshold voltages shown in graph 1000 and graph 1006 indicate the substantial increase in the threshold voltage. The threshold voltages shown in graph 1006 range from approximately 6.5 to 7.3 volts and the threshold voltages shown in graph 1000 are all approximately 9.8 volts.

Figure 11:
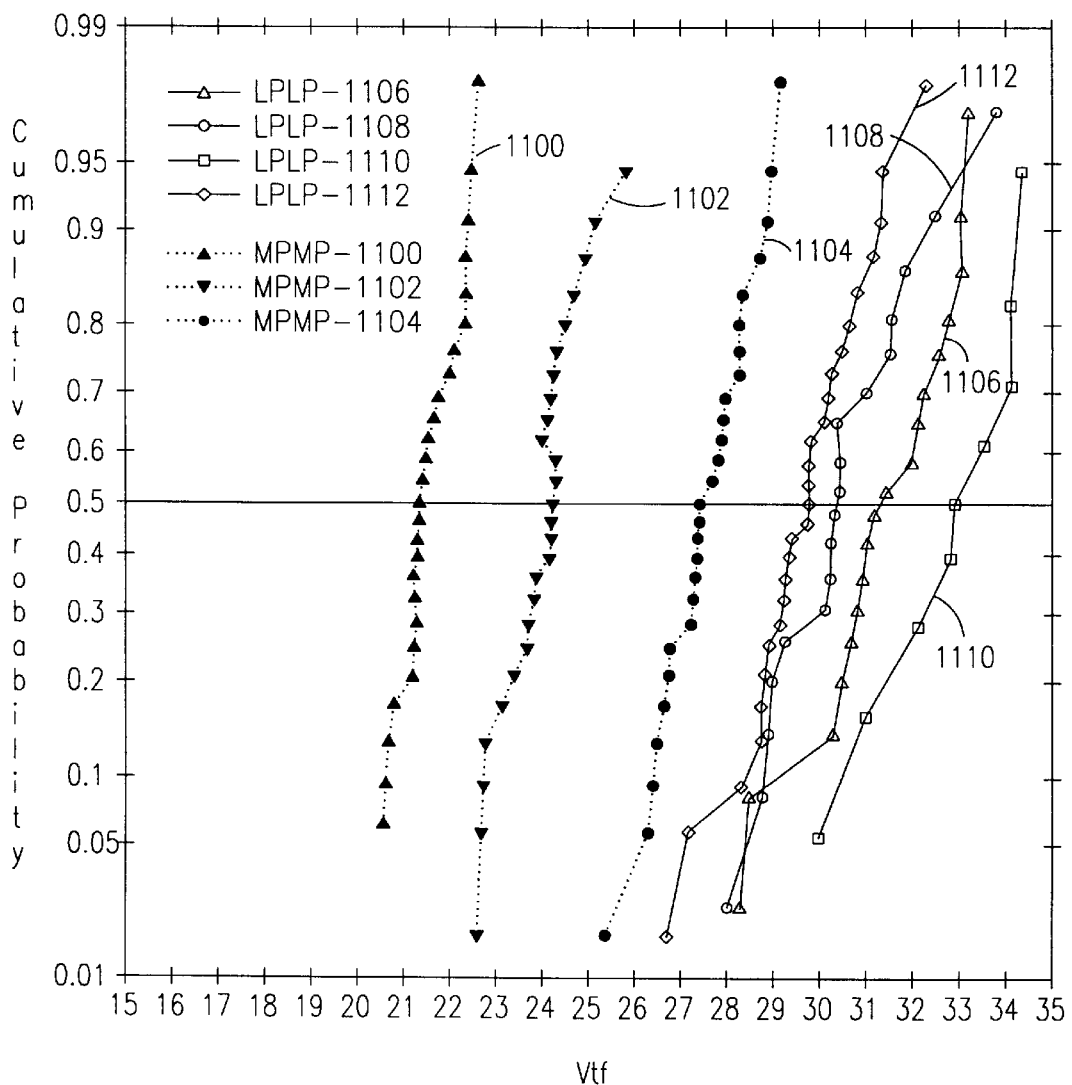
FIG. 11 compares measured values of the threshold voltages for three samples using a prior art PSG layer with measured values of the threshold voltages for four samples using a PSG layer in accordance with the present invention.

FIG. 11 compares the threshold voltages 1100, 1102, and 1104 of semiconductor devices manufactured in accordance with the prior art with the threshold voltages 1106, 1108, 1110, and 1112 of similar semiconductor devices manufactured in accordance with the present invention. The threshold voltages of the prior art devices are substantially lower than the threshold voltages of the devices manufactured in accordance with the present invention.

The foregoing description of the embodiments of the invention has been presented for purposes of illustration and description. It is not intended to be exhaustive or to limit the invention to the precise form disclosed. Obvious modifications or variations are possible in light of the above teachings. The embodiments were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A method of manufacturing a semiconductor device, the method comprising:

forming at least a first active region and at least a second active region in a semiconductor substrate wherein the at least the first active region and the at least the second active region are isolated from one another by a field oxide region, wherein the field oxide region and a portion of the at least a first active region and a portion of the at least second active region form a parasitic transistor having a threshold voltage;

forming a gate structure on the at least a first active region and a gate structure on the at least a second active region; and increasing the threshold voltage of the parasitic transistor by forming a permanent low power-low pressure phosphosilicate glass layer over the at least the first active region, over the at least the second active region and over the field oxide region.

2. The method of claim 1, the method further comprising forming a planarized TEOS layer over the permanent low power-low pressure phosphosilicate glass layer.

3. The method of claim 2, the method further comprising forming a metal layer over the TEOS layer.

4. The method of claim 3, the method further comprising forming an undoped oxide layer between the permanent phosphosilicate glass layer and the at least two active regions and the field oxide region.

5. The method of claim 1, the method of forming a low power-low pressure phosphosilicate glass layer comprises forming the permanent low power-low pressure phosphosilicate glass layer using the following process parameters:

$SiH_4$ at approximately 300 sccm;

$PH_3$ at approximately 440 sccm;

$N_2O$ at approximately 9500 sccm;

$N_2$ at approximately 100 sccm;

HF power equal to 450 watts;

LF power equal to 300 watts;

pressure at approximately 1.8 torr;

temperature at 400° C.; and chamber conditioning for 120 seconds.

6. A method of manufacturing a semiconductor device, the method comprising:

forming at least a first active region and at least a second active region in a semiconductor substrate wherein the at least the first active region and the at least the second active region are isolated from one another by a field oxide region, wherein the field oxide region and a portion of the at least a first active region and a portion of the at least second active region form a parasitic transistor having a threshold voltage;

forming a gate structure on the at least a first active region and a gate structure on the at least a second active region;

forming a polysilicon layer on the field oxide region to serve as an interconnect between the at least the first active region and the at least the second active region; and increasing the threshold voltage of the parasitic transistor by forming a permanent low power-low pressure phosphosilicate glass layer over the at least the first active region, over the at least the second active region and over the polysilicon layer.

7. The method of claim 6, the method further comprising forming a planarized TEOS layer over the permanent low power-low pressure phosphosilicate glass layer.

8. The method of claim 7, the method further comprising forming a metal layer over the TEOS layer.

9. The method of claim 8, the method further comprising forming an undoped oxide layer between the permanent phosphosilicate glass layer and the at least the first active region, the at least the second active region and the polysilicon layer formed on the field oxide region.

10. The method of claim 6, the method of forming a permanent low power-low pressure phosphosilicate glass layer comprises forming the low power-low pressure phosphosilicate glass layer using the following process parameters:

$SiH_4$ at approximately 300 sccm;

$PH_3$ at approximately 440 sccm;

$N_2$) at approximately 9500 sccm;

$N_2$ at approximately 100 sccm;

HF power equal to 450 watts;

LF power equal to 300 watts;

pressure at approximately 1.8 torr;

temperature at 400° C.; and chamber conditioning for 120 seconds.

* * * * *